United States Patent [19]

Nakahata et al.

[11] Patent Number: 5,393,715
[45] Date of Patent: Feb. 28, 1995

[54] ALUMINUM NITRIDE SINTERED BODY AND METHOD OF PREPARING THE SAME

[75] Inventors: Seiji Nakahata; Takahiro Matsuura; Kouichi Sogabe; Akira Yamakawa, all of Hyogo, Japan

[73] Assignee: Sumitomo Electric Industries, Ltd., Osaka, Japan

[21] Appl. No.: 115,446

[22] Filed: Sep. 1, 1993

[30] Foreign Application Priority Data

Sep. 4, 1992 [JP] Japan .................. 4-236689
Aug. 24, 1993 [JP] Japan .................. 5-209263

[51] Int. Cl.⁶ .............................................. C04B 35/58
[52] U.S. Cl. .................................................. 501/98
[58] Field of Search ................................ 501/96, 98

[56] References Cited

U.S. PATENT DOCUMENTS

| | | | |
|---|---|---|---|
| 4,997,798 | 3/1991 | Okuno et al. | 501/98 |
| 5,001,089 | 3/1991 | Kasori et al. | 501/96 |
| 5,219,803 | 6/1993 | Yamakawa et al. | 501/96 |
| 5,264,388 | 11/1993 | Yamakawa et al. | 501/96 |
| 5,273,700 | 12/1993 | Yamakawa et al. | 501/96 |

FOREIGN PATENT DOCUMENTS 0507961 10/1992 European Pat. Off. ..... C04B 35/58

*Primary Examiner*—Deborah Jones
*Attorney, Agent, or Firm*—W. G. Fasse; W. F. Fasse

[57] ABSTRACT

An aluminum nitride sintered body has a high breakdown voltage for serving as a substrate material particularly suited to highly integrated circuits. The aluminum nitride sintered body contains titanium, which is included as a solid solute in the aluminum nitride crystal lattice in a weight ratio of at least 50 ppm and not more than 1000 ppm. The unpaired electron concentration in the sintered body as determined from an absorption spectrum of electron spin resonance is at least $1 \times 10^{13}/g$. At least 0.1 percent by weight and not more than 5.0 percent by weight, in terms of $TiO_2$, of an oxy-nitride of titanium and aluminum exists in the aluminum nitride sintered body. The aluminum nitride sintered body has a breakdown voltage of 20 kV/mm. The sintered body is obtained by nitriding aluminum nitride raw material powder in a nitrogen atmosphere at a temperature of 800° to 1400° C., adding an oxy-nitride of titanium thereto with a sintering assistant, and sintering the mixture.

6 Claims, 4 Drawing Sheets

ALUMINUM NITRIDE SINTERED BODY AND METHOD OF PREPARING THE SAME

BACKGROUND OF THE INVENTION

1. Field of the Invention

The present invention relates to an aluminum nitride sintered body having a high breakdown voltage particularly suited to the requirements of high integration of a circuit board.

2. Description of the Background Art

An aluminum nitride sintered body having a high thermal conductivity is used as a radiating material such as a substrate for a semiconductor device or a circuit board, for example. At present, the high integration of circuit boards is being developed in order to cope with high speed processing of mass data and miniaturization of information processing equipment. A material for such a highly integrated circuit board must have an excellent radiating property in order to cope with the heat generated by high integration, and must have a high breakdown voltage in order to cope with the narrow spaces existing between circuit wires.

An aluminum nitride sintered body is being considered with interest as an excellent radiating substrate material, due to its high thermal conductivity. A conventional aluminum nitride sintered body has a breakdown voltage of about 10 to 20 kV/mm. Thus, what is still awaited in the field is an aluminum nitride sintered body, which is applicable to a highly integrated circuit board and which has a high breakdown voltage of at least 20 kV/mm.

SUMMARY OF THE INVENTION

An object of the present invention is to provide an aluminum nitride sintered body having a high breakdown voltage as a substrate material that is particularly suited to the requirements of high integration of a circuit.

In order to solve the aforementioned problem, the inventors have found that it is possible to remarkably improve the breakdown voltage of an aluminum nitride sintered body by forming and dispersing an oxy-nitride of titanium and aluminum, such as aluminate nitride of titanium, for example, in a sintered body of aluminum nitride and partially including titanium as a solid solute in the aluminum nitride crystal grains. The present invention has resulted from the following observations by the inventors.

Figure 1:
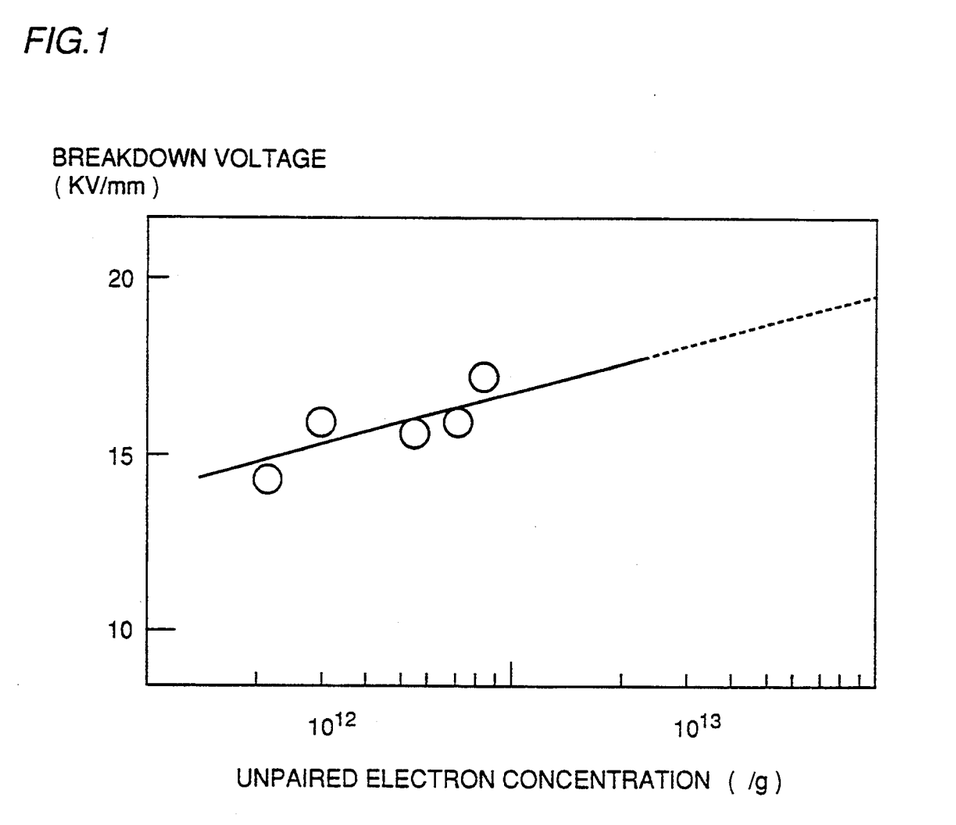
FIG. 1 is a graph showing a relation between an unpaired electron concentration and a breakdown voltage in an aluminum nitride sintered body.

The inventors have found that there is a relation, as shown in FIG. 1, between the breakdown voltage of an aluminum nitride sintered body and the unpaired electron concentration measured from an electron spin resonance absorption spectrum. It is understood from FIG. 1 that the value of the breakdown voltage increases slightly as the unpaired electron concentration increases in the aluminum nitride sintered body. However, it has previously not been possible to obtain an aluminum nitride sintered body having a breakdown voltage exceeding 20 kV/mm as a material for a circuit board that is suitable for high integration.

After much further study, the inventors have succeeded in increasing the unpaired electron concentration by preparing an aluminum nitride sintered body through the following two steps. In a first step, aluminum nitride raw material powder is nitrided in a nitrogen atmosphere at a temperature of 800° to 1400° C., to convert a surface composition of the raw material powder from aluminum oxide ($Al_2O_3$) to aluminum oxynitride ($Al_xO_yN_z$: $0<X<1$, $0<Y<1$, $0<Z<1$). In a second step, an oxy-nitride of titanium (or titanium oxide covered with aluminum salt of a fatty acid such as aluminum stearate or aluminum laurate) is added to the nitrided aluminum nitride raw material powder with a sintering assistant, such as a rare earth oxide such as $Y_2O_3$ or an alkaline earth oxide such as CaO, and the mixture is sintered. Through these two steps, the inventors have succeeded in extremely increasing the unpaired electron concentration of the aluminum nitride sintered body, improving its thermal conductivity and remarkably improving the value of its breakdown voltage as compared with the prior art.

The aluminum nitride sintered body according to the present invention comprises aluminum nitride crystal grains, in which titanium element is included as a solid solute in a weight ratio of at least 50 ppm and not more than 1000 ppm.

Further, the aluminum nitride sintered body according to the present invention contains an oxy-nitride of titanium and aluminum compound in a weight ratio of at least 0.1% and not more than 5.0% in terms of $TiO_2$, with an unpaired electron concentration, as measured from an absorption spectrum of electron spin resonance, of at least $1 \times 10^{13}$/g. More preferably, the oxy-nitride of titanium and aluminum compound exists in the aluminum nitride sintered body in the form of grains, which are not more than 800 nm in diameter. The aluminum nitride sintered body has a thermal conductivity of at least 150 W/mK.

On the other hand, a method of preparing an aluminum nitride sintered body according to the present invention comprises the following steps:

a) preparing aluminum nitride powder;
b) nitriding the aluminum nitride powder in an atmosphere containing nitrogen at a temperature of at least 800° C. and not more than 1400° C.;
c) adding a sintering assistant, and an oxy-nitride of titanium, being in a weight ratio of at least 0.1% and not more than 5.0% in terms of $TiO_2$, to the nitrided aluminum nitride powder, thereby obtaining a mixed powder;
d) preparing a compact from the mixed powder; and
e) firing the compact in an atmosphere containing nitrogen, thereby preparing an aluminum nitride sintered body.

A method of preparing an aluminum nitride sintered body according to another aspect of the present invention comprises the following steps:

a) preparing aluminum nitride powder;
b) ion implanting titanium into the aluminum nitride powder, thereby making titanium exist in the aluminum nitride crystal lattice in a weight ratio of at least 50 ppm and not more than 1000 ppm;
c) adding a sintering assistant to the aluminum nitride powder containing titanium for obtaining a mixed powder;
d) preparing a compact from the mixed powder; and
e) firing the compact in an atmosphere containing nitrogen, thereby preparing an aluminum nitride sintered body.

Figure 2:
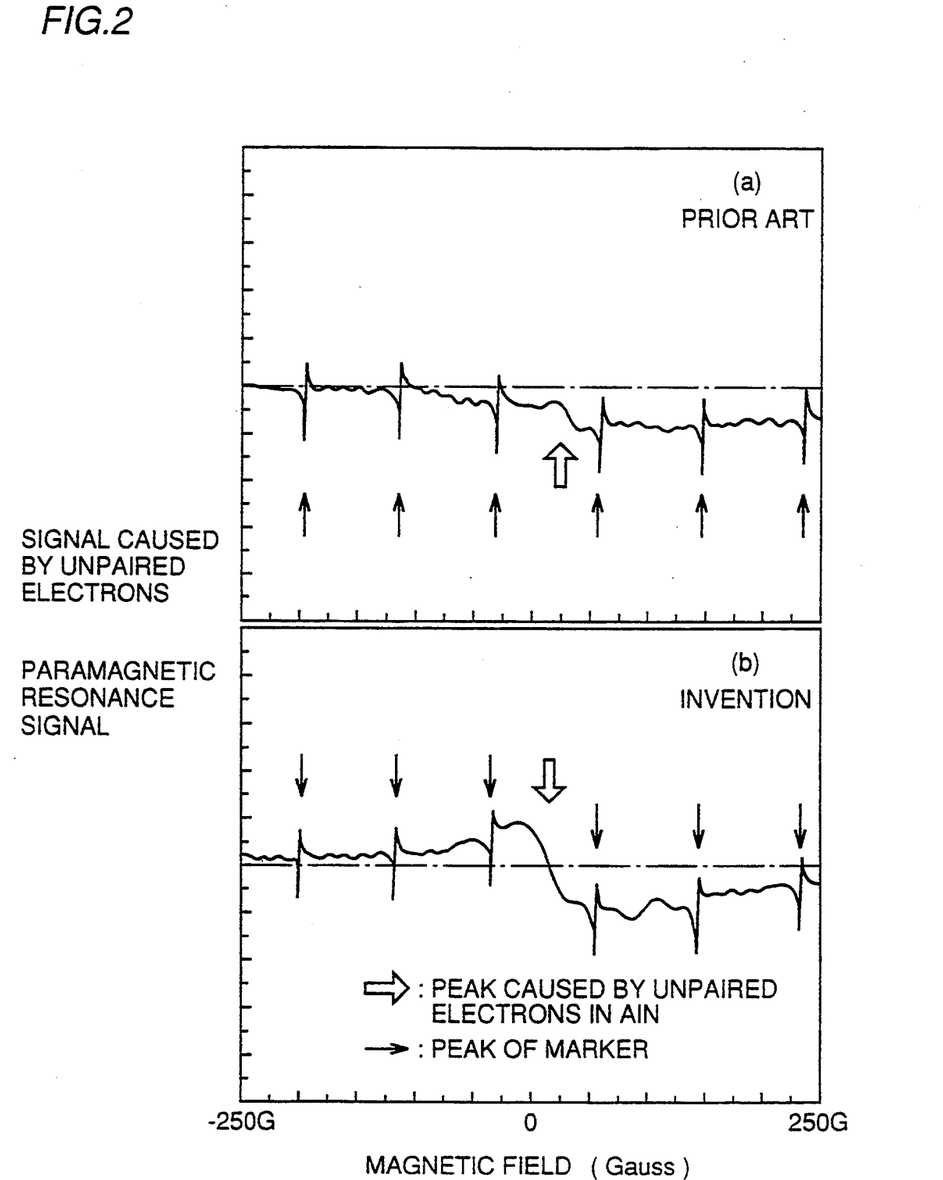
FIG. 2 is a graph showing absorption spectra of electron spin resonance obtained from a conventional aluminum nitride sintered body (graph a) and an aluminum nitride sintered body according to the present invention (graph b)

FIG. 2 illustrates absorption spectra of electron spin resonance obtained from a conventional aluminum nitride sintered body and an aluminum nitride sintered body according to the present invention. It is understood from FIG. 2 that the intensity of the absorption spectrum of electron spin resonance obtained from the inventive aluminum nitride sintered body is remarkably increased as compared with that of the prior art. Referring to FIG. 2, the term "marker" indicates a standard material that exhibits a peak in a certain constant magnetic field. This standard material is measured together with an unknown sample, in order to exclude measurement errors caused by the apparatus.

The reason why the intensity of the absorption spectrum of electron spin resonance obtained from the inventive aluminum nitride sintered body is increased has not yet been clarified. However, it can be considered as follows. First, the aluminum oxy-nitride which is formed on the surface of the aluminum nitride raw material powder by the above-mentioned surface treatment (for example, Reaction Formula: I below) reacts with the oxy-nitride of titanium added thereto, to form an oxy-nitride (Ti—Al—O—N) of titanium and aluminum (for example, Reaction Formula: II below). Since such an oxy-nitride of titanium and aluminum is instable at high temperatures exceeding 1000° C. as compared with an oxide (Ti—Al—O) of titanium and aluminum, a replacement reaction occurs between oxygen (—bivalent) contained in the aluminum nitride crystal grains as an impurity and nitrogen (—trivalent) in the aluminate nitride of titanium (oxy-nitride of titanium and aluminum) (for example, Reaction Formula: III below). Thus, the oxy-nitride of titanium and aluminum may conceivably be stabilized by approaching the composition of Ti—Al—O. At this time, a minus valence number is increased in the aluminum nitride crystal while a plus valence number is increased in the oxy-nitride of titanium and aluminum, whereby the material enters an electrically unbalanced state. In order to compensate for such a state, however, replacement occurs between aluminum (+trivalent) in the aluminum nitride crystal and titanium (+tetravalent) in the aluminate nitride of titanium, to recover electrically neutral conditions. As a result, titanium is conceivably included as a solid solute in the aluminum nitride crystal, which increases the unpaired electron concentration. Thus, the intensity of the absorption spectrum of electron spin resonance obtained from the inventive aluminum nitride sintered body is remarkably increased.

Reaction Formulas (I)

$$2Al_2O_3 + N_2 \longrightarrow Al_4O_3N_2 + \tfrac{3}{2} O_2 \uparrow$$

(II)

$$Al_4O_3N_2 + Ti_3O_3N_2 \longrightarrow Ti_3Al_4O_6N_4$$

(III)

$$Al_{1-\tfrac{x}{3}} N_{1-x}O_x + Ti_3Al_4O_6N_4 \longrightarrow$$

$$Al_{1-\tfrac{4}{3}x} Ti_xN + Ti_{3-x}Al_{4+x}O_{6+x}N_{4-x}$$

The aluminum nitride sintered body preferably contains at least 0.1 percent by weight and not more than 5.0 percent by weight the oxy-nitride of titanium and aluminum compound in terms of $TiO_2$, including titanium which is contained as a solid solute in the aluminum nitride crystal lattice. If the content of the oxy-nitride of titanium and aluminum compound is less than 0.1 percent by weight, then the unpaired electron concentration is not increased much and the value of the breakdown voltage of the as-obtained aluminum nitride sintered body remains substantially similar to that of the prior art. If the content of the nitride of titanium and aluminum compound exceeds 5.0 percent by weight, on the other hand, then the grains of this oxy-nitride of titanium and aluminum compound formed in the aluminum nitride sintered body disadvantageously exceeds 800 nm in diameter, which inhibits the original high thermal conductivity of the aluminum nitride sintered body and reduces the heat radiation property of the sintered body for serving as a circuit board material.

Furthermore, titanium is not included as a solid solute in the aluminum nitride crystal grains if a surface treatment is not carried out on the aluminum nitride raw material powder or a compound of titanium is not added in the form of an oxy-nitride. Thus, an increase in the breakdown voltage of the aluminum nitride sintered body cannot be expected.

In the inventive aluminum nitride sintered body, titanium must be included as a solid solute in the aluminum nitride crystal lattice in a weight ratio of at least 50 ppm and not more than 1000 ppm. If the amount of the dissolved titanium is less than 50 ppm, the unpaired electron concentration decreases and thus the breakdown voltage is insufficient. If the amount of the solidly dissolved titanium exceeds 1000 ppm, on the other hand, the thermal conductivity deteriorates and thus the radiating property is insufficient.

In the inventive aluminum nitride sintered body, further, the unpaired electron concentration as determined from an absorption spectrum of electron spin resonance is preferably at least $1 \times 10^{13}$/g, because it is possible to ensure a breakdown voltage of at least 20 kV/mm in this case.

The aluminum nitride sintered body, which is obtained by forming and dispersing an oxy-nitride of titanium and aluminum compound in an aluminum nitride sintered body and partially including titanium as a solid solute in the aluminum nitride crystal grains can be prepared by the following method.

Commercially available aluminum nitride raw material powder is nitrided in an atmosphere containing nitrogen within a temperature range of 800° to 1400° C. The temperature range is set at 800° to 1400° C. because no nitriding reaction progresses on the surface of the aluminum nitride raw material powder if the temperature is less than 800° C., while the grain size of the powder is increased due to a solid phase reaction between aluminum nitride grains, which suppresses the dispersion of an oxy-nitride of titanium which is added in a later step if the temperature exceeds 1400° C.

Then, 0.3 to 3.0 percent by weight, in terms of CaO, of a sintering assistant such as $Y_2O_3$ or $CaCO_3$ is added to the aluminum nitride raw material powder which has been surface-treated in the aforementioned manner, with addition of 0.1 to 5.0 percent by weight, in terms of $TiO_2$, of an oxy-nitride of titanium. At this time, the oxy-nitride of titanium as added preferably has a particle size of not more than 1 μm. More preferably not more than 0.1 μm, so that the same is formed and dispersed in the aluminum nitride sintered body as an oxy-nitride of titanium and aluminum, and titanium is easily solidly dissolved in the aluminum nitride crystal grains. Then, about 1.0 to 3.0 percent by weight of a binder such as polyvinyl butyral is added to this aluminum nitride mixed powder, and mixed with the same in a ball mill for about 12 to 72 hours. Thereafter the powder is dried and granulated, whereupon the as-obtained powder is compacted under a pressure of 1.5 ton/cm², to obtain a pressed compact. At this time, the pressed compact is preferably 1.8 to 2.0 g/cm³ in density. Thereafter, the pressed compact is debindered in a nitrogen atmosphere at a temperature of 600° to 800° C. for about 2 to 3 hours. The debindered pressed compact is fired in an atmosphere containing nitrogen at a temperature of 1500° to 1900° C. for about 2 to 5 hours, to obtain an aluminum nitride sintered body.

In comparison to the aforementioned method, it is also possible to obtain an aluminum nitride sintered body having a high breakdown voltage by ion-implanting titanium into the aluminum nitride raw material powder to make titanium exist in the aluminum nitride crystal grains and thereafter adding a sintering agent and a binder and carrying out mixing, granulation, press molding, debindering and firing under the same conditions as described above.

The inventors have studied and analyzed an aluminum nitride sintered body having an unpaired electron concentration of at least $1 \times 10^{13}$/g obtained from an absorption spectrum of electron spin resonance with an SEM (scanning electron microscope) or a TEM (transmission electron microscope). Consequently, it has been proved that crystal grains other than aluminum nitride crystal grains existed in the aluminum nitride sintered body. These grains were subjected to elementary analysis through an EDX (energy dispersive X-ray analysis) or AES (Auger electron spectroscopy) or SIMS (Secondary Ion Mass Spectroscopy), to prove that the grains formed in the aluminum nitride crystal grains included Ti, Al, N, O, Ca, Mg, Si and C, and were mainly composed of Ti, Al, and N. Further, grains of a titanium compound formed in the aluminum nitride sintered body existed as dispersed grains of not more than 0.8 μm (800 nm) in mean grain size.

Figure 3A:
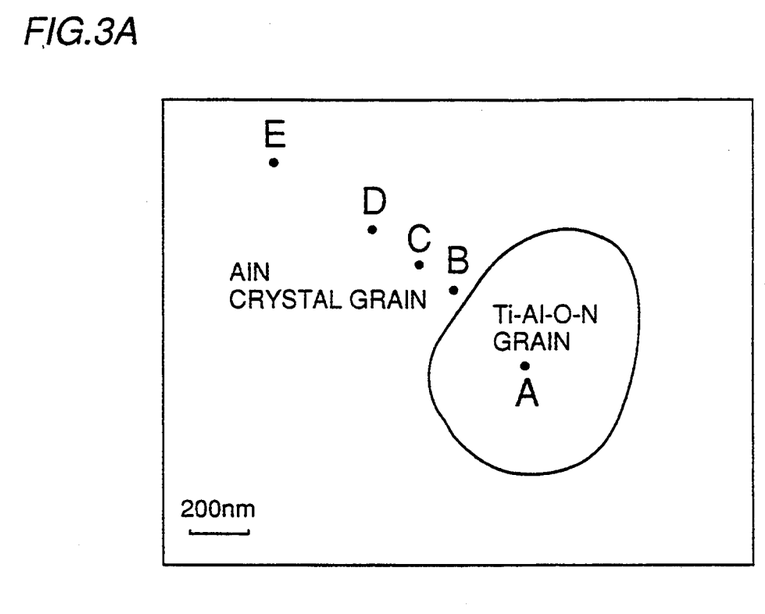
FIG. 3A typically illustrates a TEM image of a Ti—Al—O—N grain contained in an aluminum nitride crystal grain.
Figure 3B:
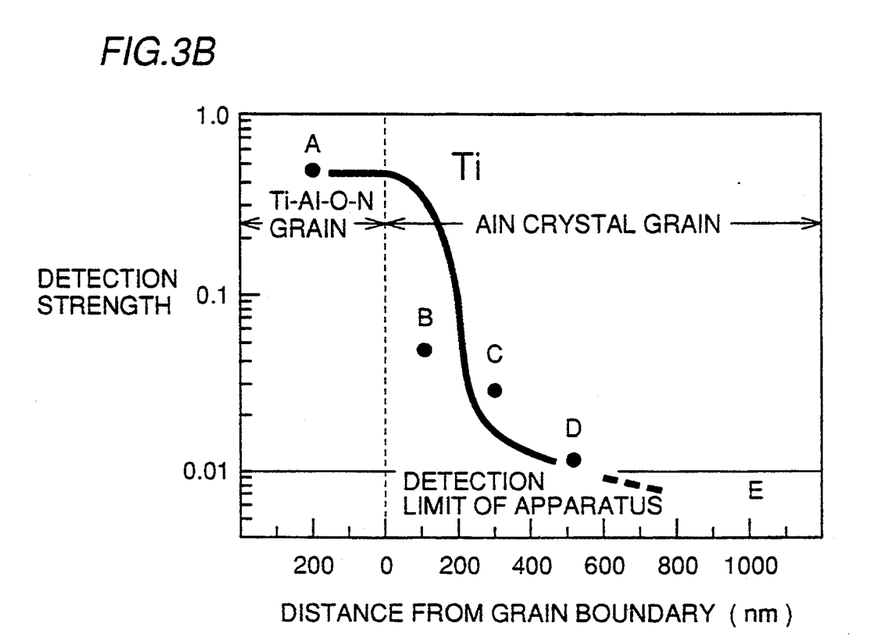
FIG. 3B is a graph showing results of EDX analysis of Ti distribution in the aluminum nitride crystal grain and Ti—Al—O—N grain shown in FIG. 3A.

FIG. 3A typically shows a TEM image of a Ti—Al—O—N grain contained in an aluminum nitride crystal grain, and FIG. 3B shows results of EDX analysis of Ti in respective points A to E in FIG. 3A. As shown by the results in FIG. 3B of the EDX analysis of the inside of the aluminum nitride crystal grain around the titanium compound grain, it has been clarified that Ti was diffused from the titanium compound grain of Ti—Al—O—N existing in the AlN grains into the aluminum nitride crystal grain. It has also been proved that the amount of Ti as a solid solute in the aluminum nitride crystal lattice, which was varied with sintering conditions, was within a range of 50 to 1000 ppm.

According to the present invention, as herein described, titanium is included as a solid solute in the aluminum nitride crystal lattice in a weight ratio of at least 50 ppm and not more than 1000 ppm, whereby the unpaired electron concentration of the aluminum nitride sintered body can be extremely increased, thereby remarkably improving the breakdown voltage as compared with the prior art. Further, the inventive aluminum nitride sintered body has an unpaired electron concentration of at least $1 \times 10^{13}$/g as determined from an electron spin resonance absorption spectrum, contains at least 0.1 percent by weight and not more than 5.0 percent by weight of an oxy-nitride of titanium and aluminum in terms of $TiO_2$, and is provided with a high breakdown voltage of at least 20 kV/mm. The inventive aluminum nitride sintered body has an excellent heat radiation property and is sufficiently suitable for use as a circuit board material responsive to the high integration of the circuit.

According to the present invention, it is possible to obtain an aluminum nitride sintered body which has a higher breakdown voltage as compared with the prior art. Hence, a highly integrated circuit design is enabled when the inventive sintered body is used as a circuit board material. Thus, it is possible to contribute to the high-speed processing of information by means of high integration of the circuit, as well as to miniaturization of information processing equipment.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Aluminum nitride raw material powder shown at A in Table 1 was surface-treated in a nitrogen atmosphere at a temperature of 800° C., and thereafter 0.5 percent by weight of $Y_2O_3$ serving as a sintering assistant was added to this material along with the addition of 0.2 percent by weight, in terms of $TiO_2$, of an oxynitride of titanium ($Ti_3O_3N_2$). The obtained powder was mixed in alcohol in a tumbling ball mill for 12 hours, as shown in Table 2. Thereafter 2 percent by weight of polyvinyl butyral was added as a binder to this mixed powder, which in turn was further sufficiently mixed and dried. The obtained powder was press-compacted under a pressure of at least 1.5 ton/cm². The obtained pressed compact was debindered at a temperature of 600° C. for 2 hours, and then fired in a nitrogen atmosphere at a sintering temperature of 1800° C. for 3 hours. The obtained aluminum nitride sintered body was subjected to measurement of density, breakdown voltage, thermal conductivity, unpaired electron concentration, mechanical strength and the amount of titanium contained as a solid solute in the aluminum nitride crystal grains. The sintered body density was measured by an Archimedes' method, the thermal conductivity was measured by a laser flash method, the unpaired electron concentration was measured with an electron spin resonator, the mechanical strength was measured as the JIS three-point bending strength, and the amount of titanium contained as a solid solute was measured with EDX of TEM or AES or SIMS. Table 3 shows the results.

EXAMPLES 2 TO 16

The aluminum nitride raw powder materials shown in Table 1 were treated at surface treatment temperatures shown in Table 2, and thereafter subjected to mixing with sintering assistants and press compacting, similarly to Example 1. The obtained pressed compacts were fired under sintering conditions shown in Table 2 by a method similar to that in Example 1, to prepare 15 types of aluminum nitride sintered bodies. Table 3 shows measurement values obtained as to these samples.

EXAMPLE 17

Ti ions were implanted into the aluminum nitride raw material powder shown at A in Table 1, with an energy of 4 MeV at about $10^{18}$ ions/cm$^2$. 0.5 percent by weight of $Y_2O_3$ was added to this powder and mixed in alcohol in a tumbling ball mill for 12 hours. Thereafter an aluminum nitride sintered body was formed in a similar manner to Example 1. Table 3 also shows measurement values obtained as to this sample.

TABLE 1

| Raw Material Powder | A | B | C |
|---|---|---|---|
| Total Oxygen Content (wt. %) | 1.3 | 0.9 | 1.2 |
| Carbon Content in Raw Material Powder (ppm) | 300 | 230 | 500 |
| Fe Content in Raw Material Powder (ppm) | <10 | <10 | <10 |
| Si Content in Raw Material Powder (ppm) | 9 | 50 | 82 |
| Specific Surface Area of Raw Material Powder (m$^2$/g) | 3.5 | 2.8 | 2.7 |
| Mean Particle Size of Raw Material Powder (μm) | 1.3 | 1.1 | 1.0 |

TABLE 2

| Example | Employed Raw Material Powder | Surface Treatment Temperature (°C.) | Sintering Assistant (wt. %) | Ti Compound (wt. %, in terms of TiO$_2$) | Sintering Temperature (°C.) | Sintering Time (hr.) |
|---|---|---|---|---|---|---|
| 1 | A | 800 | Y$_2$O$_3$: 0.5 | Ti$_3$O$_3$N$_2$: 0.2 | 1800 | 3 |
| 2 | A | 1000 | Yb$_2$O$_3$: 0.5 | Ti$_3$O$_3$N$_2$: 0.5 | 1800 | 5 |
| 3 | A | 1200 | CaO: 0.5 | Ti$_3$O$_3$N$_2$: 0.5 | 1800 | 5 |
| 4 | B | 1200 | Nd$_2$O$_3$: 0.5 | Ti$_3$O$_3$N$_2$: 0.5 | 1800 | 5 |
| 5 | B | 1300 | Sm$_2$O$_3$: 0.5 | Ti$_3$O$_3$N$_2$: 0.5 | 1800 | 5 |
| 6 | B | 1000 | Y$_2$O$_3$: 0.5 CaO: 0.5 | Ti$_3$O$_3$N$_2$: 1.0 | 1650 | 3 |
| 7 | B | 1000 | Yb$_2$O$_3$: 0.5 CaO: 0.5 | Ti$_3$O$_3$N$_2$: 1.0 | 1650 | 5 |
| 8 | C | 1000 | Y$_2$O$_3$: 0.5 Nd$_2$O$_3$: 0.5 | Ti$_3$O$_3$N$_2$: 1.0 | 1650 | 5 |
| 9 | C | 800 | Yb$_2$O$_3$: 0.5 Nd$_2$O$_3$: 0.5 | Ti$_3$O$_3$N$_2$: 1.0 | 1650 | 5 |
| 10 | C | 1200 | Nd$_2$O$_3$: 0.5 CaO: 0.5 | Ti$_3$O$_3$N$_2$: 1.0 | 1650 | 3 |
| 11 | C | 1200 | Y$_2$O$_3$: 1.5 | Ti$_3$O$_3$N$_2$: 1.5 | 1800 | 5 |
| 12 | C | 1400 | Yb$_2$O$_3$: 1.5 | Ti$_3$O$_3$N$_2$: 1.5 | 1800 | 5 |
| 13 | A | 1300 | Y$_2$O$_3$: 1.5 Yb$_2$O$_3$: 1.5 | Ti$_3$O$_3$N$_2$: 1.5 | 1800 | 5 |
| 14 | A | 1200 | Y$_2$O$_3$: 1.5 Nd$_2$O$_3$: 1.5 | Ti$_3$O$_3$N$_2$: 2.0 | 1800 | 3 |
| 15 | B | 1200 | Yb$_2$O$_3$: 1.5 CaO: 1.5 | Ti$_3$O$_3$N$_2$: 5.0 | 1500 | 5 |
| 16 | B | 1200 | Yb$_2$O$_3$: 1.5 Nd$_2$O$_3$: 1.5 | Ti$_3$O$_3$N$_2$: 3.0 | 1800 | 5 |
| 17 | A | — | Y$_2$O$_3$: 0.5 | Ti Ion Implantation ($10^{18}$ ions/cm$^2$) | 1800 | 3 |

TABLE 3

| Example | Content of Ti as Solid Solute (ppm) | Break Down Voltage (kV/mm) | Density (g/cm$^3$) | Mechanical Strength (kg/mm$^2$) | Unpaired Electron Concentration (/g) | Thermal Conductivity (W/m · K) |
|---|---|---|---|---|---|---|
| 1 | 60 | 31 | 3.27 | 48 | $2.7 \times 10^{13}$ | 170 |
| 2 | 100 | 41 | 3.27 | 45 | $6.0 \times 10^{13}$ | 169 |
| 3 | 780 | 47 | 3.26 | 48 | $1.5 \times 10^{14}$ | 160 |
| 4 | 480 | 46 | 3.27 | 42 | $1.0 \times 10^{14}$ | 152 |
| 5 | 220 | 41 | 3.27 | 47 | $9.0 \times 10^{13}$ | 150 |
| 6 | 440 | 40 | 3.27 | 41 | $7.9 \times 10^{13}$ | 190 |
| 7 | 650 | 52 | 3.28 | 43 | $1.6 \times 10^{14}$ | 170 |
| 8 | 170 | 35 | 3.28 | 45 | $5.5 \times 10^{13}$ | 165 |
| 9 | 440 | 44 | 3.27 | 42 | $1.1 \times 10^{14}$ | 155 |
| 10 | 920 | 50 | 3.28 | 45 | $1.6 \times 10^{14}$ | 155 |
| 11 | 320 | 44 | 3.27 | 48 | $7.8 \times 10^{13}$ | 230 |
| 12 | 110 | 39 | 3.27 | 43 | $4.9 \times 10^{13}$ | 200 |
| 13 | 800 | 52 | 3.28 | 41 | $1.1 \times 10^{14}$ | 234 |
| 14 | 650 | 48 | 3.28 | 46 | $1.0 \times 10^{14}$ | 178 |
| 15 | 50 | 35 | 3.12 | 40 | $3.2 \times 10^{13}$ | 150 |
| 16 | 80 | 39 | 3.28 | 45 | $3.5 \times 10^{13}$ | 217 |
| 17 | 80 | 32 | 3.27 | 40 | $2.1 \times 10^{13}$ | 165 |

It is clearly understood from Table 3 that the unpaired electron concentration as determined from an electron spin resonance absorption spectrum exceeds $1 \times 10^{13}$/g when the amount of Ti contained as a solid solute is at least 50 ppm and not more than 1000 ppm in a weight ratio, and the aluminum nitride sintered body exhibits e high breakdown voltage. It is also understood that an aluminum nitride sintered body that has an unpaired electron concentration of at least $1 \times 10^{13}$/g and contains a compound of titanium within a range of 0.1 to 5.0 percent by weight in terms of $TiO_2$ has a high breakdown voltage.

As to the aluminum nitride sintered bodies obtained according to Examples 1, 2, 4 and 5, titanium compounds contained in the aluminum nitride crystal particles were examined through XRD (Xray diffraction) or EDX. As a result, it was proved that the titanium compounds contained in the aluminum nitride sintered bodies were composed of Ti, Al, O and N, or Ti, Al, N, O, Ca, Mg and Si.

tivity, unpaired electron concentration, mechanical strength, and the amount of titanium contained as a solid solute in the aluminum nitride crystal grains. The sintered body density was measured by an Archimedes' method, the thermal conductivity was measured by a laser flesh method, the unpaired electron concentration was measured with an electron spin resonator, the mechanical strength was measured as the JIS three-point bending strength, and the amount of titanium was measured with EDX of TEM or AES or SIMS. Table 5 shows the results.

COMPARATIVE EXAMPLES 2 TO 11

The aluminum nitride raw powder materials shown in Table i were surface-treated under conditions shown in Table 4, thereafter subjected to mixing, compacting and debindering in a method similar to that in comparative example 1, and then sintered under sintering conditions shown in Table 4. Table 5 shows measurement values obtained as to these samples of the aluminum nitride sintered bodies.

TABLE 4

| Comparative Example | Employed Raw Material Powder | Surface Treatment Temperature (°C.) | Sintering Assistant (wt. %) | Ti Compound (wt. %, in terms of $TiO_2$) | Sintering Temperature (°C.) | Sintering Time (hr.) |
| --- | --- | --- | --- | --- | --- | --- |
| 1  | A | —    | $Y_2O_3$: 1.0 | —                  | 1800 | 5 |
| 2  | A | 1200 | $Y_2O_3$: 1.0 | —                  | 1800 | 5 |
| 3  | A | 1200 | $Y_2O_3$: 1.0 | $Ti_3O_3N_2$: 0.05 | 1800 | 5 |
| 4  | A | 1200 | $Y_2O_3$: 1.0 | $Ti_3O_3N_2$: 5.5  | 1800 | 5 |
| 5  | A | 1200 | $Y_2O_3$: 1.0 | $TiO_2$: 1.0       | 1800 | 5 |
| 6  | A | —    | $Y_2O_3$: 1.0 | $TiO_2$: 1.0       | 1800 | 5 |
| 7  | A | 1200 | $Y_2O_3$: 1.0 | TiN: 1.0           | 1800 | 5 |
| 8  | A | —    | $Y_2O_3$: 1.0 | TiN: 1.0           | 1800 | 5 |
| 9  | A | —    | $Y_2O_3$: 1.0 | $Ti_3O_3N_2$: 1.0  | 1800 | 5 |
| 10 | A | 700  | $Y_2O_3$: 1.0 | $Ti_3O_3N_2$: 1.0  | 1800 | 5 |
| 11 | A | 1500 | $Y_2O_3$: 1.0 | $Ti_3O_3N_2$: 1.0  | 1800 | 5 |

TABLE 5

| Comparative Example | Content of Ti as Solid Solute (ppm) | Break Down Voltage (kV/mm) | Density (g/cm³) | Mechanical Strength (kg/mm²) | Unpaired Electron Concentration (/g) | Thermal Conductivity (W/m · K) |
| --- | --- | --- | --- | --- | --- | --- |
| 1  | <10 | 15 | 3.27 | 32 | $4.0 \times 10^{12}$ | 137 |
| 2  | <10 | 18 | 3.26 | 35 | $9.1 \times 10^{12}$ | 140 |
| 3  | <10 | 15 | 3.27 | 30 | $9.6 \times 10^{12}$ | 149 |
| 4  | <30 | 17 | 3.28 | 36 | $6.0 \times 10^{12}$ | 139 |
| 5  | <30 | 18 | 3.28 | 34 | $7.5 \times 10^{12}$ | 142 |
| 6  | <30 | 14 | 3.28 | 38 | $9.5 \times 10^{12}$ | 138 |
| 7  | <30 | 15 | 3.27 | 33 | $8.1 \times 10^{12}$ | 141 |
| 8  | <30 | 18 | 3.27 | 31 | $7.5 \times 10^{12}$ | 142 |
| 9  | <30 | 15 | 3.27 | 34 | $6.5 \times 10^{12}$ | 140 |
| 10 | <30 | 12 | 3.27 | 31 | $5.9 \times 10^{12}$ | 137 |
| 11 | <30 | 14 | 3.27 | 36 | $4.1 \times 10^{12}$ | 139 |

COMPARATIVE EXAMPLE 1

Powder obtained by adding 1.0 percent by weight of $Y_2O_3$, in the form of fine particles for serving as a sintering assistant, to tho aluminum nitride raw material powder shown at A in Table 1 was mixed in alcohol in a tumbling ball mill for 12 hours. Thereafter 2 percent by weight of polyvinyl butyral was added as a binder to this mixed powder, which in turn was further sufficiently mixed and dried. The obtained powder was press-compacted under a pressure of at least 1.5 ton/cm². Thereafter the obtained pressed compact was debindered at a temperature of 600° C. for 2 hours, and fared in a nitrogen atmosphere under a sintering temperature of 1800° C. for 5 hours. The obtained aluminum nitride sintered body was subjected to measurement of density, breakdown voltage, thermal conduc- From the results of the examples according to the invention and the comparative examples, it is understood that an aluminum nitride sintered body that has an amount of Ti contained as a solid solute within a range of 50 to 1000 ppm in a weight ratio, or has an unpaired electron concentration of at least $1 \times 10^{13}$/g and contains an oxy-nitride of titanium and aluminum within a range of 0.1 to 5.0 percent by weight in terms of $TiO_2$, has a breakdown voltage of at least 20 kV/mm.

Figure 4:
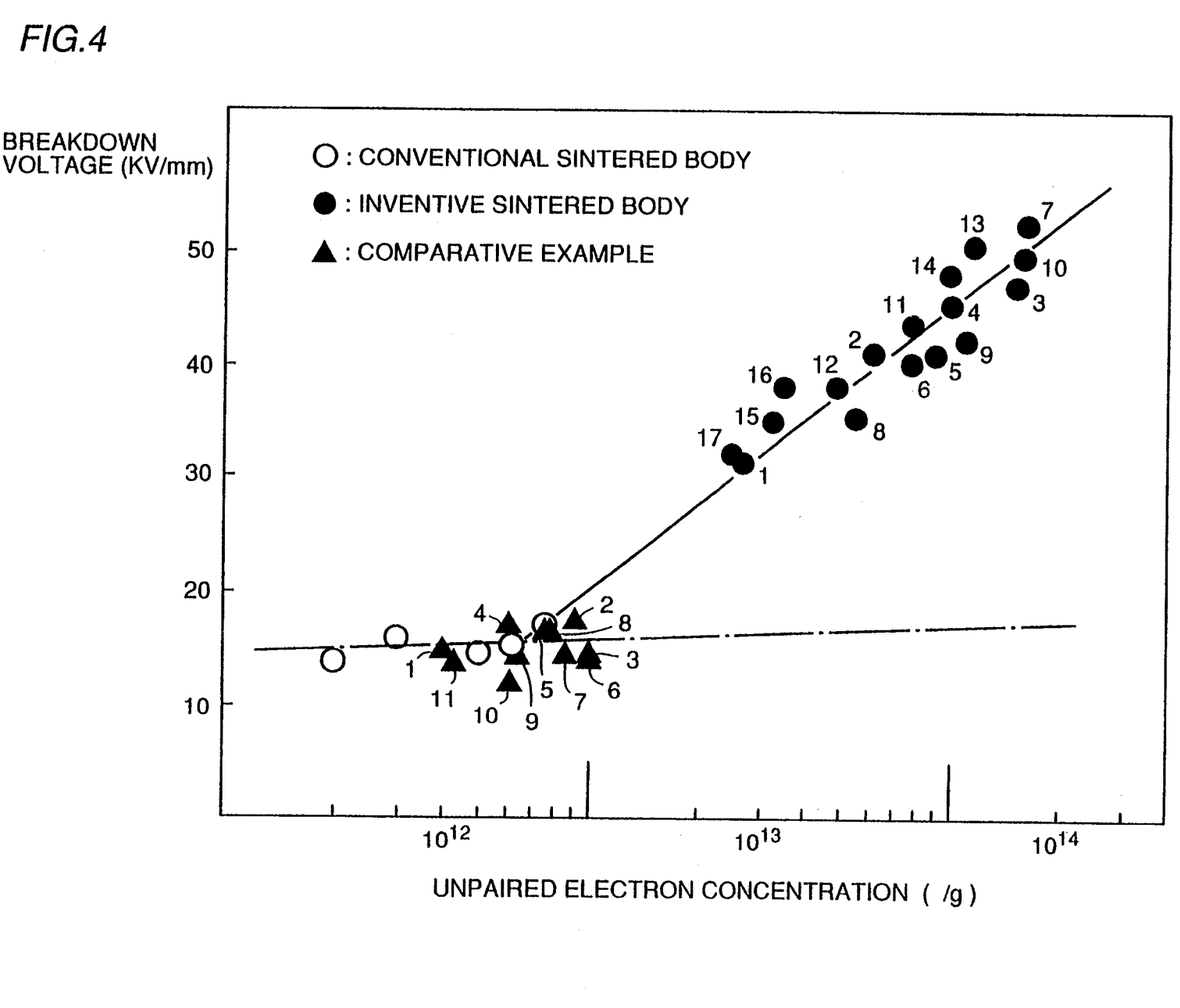
FIG. 4 is a graph showing a relation between unpaired electron concentration values and breakdown voltages in aluminum nitride sintered bodies according to comparative examples and examples of the present invention.

FIG. 4 is a graph showing a relation between breakdown voltages and unpaired electron concentration values obtained from the aforementioned results of the examples according to the invention and the comparative examples, in addition to the general relation between the breakdown voltage and the unpaired electron concentration shown in FIG. 1. It is understood from this figure that the values of the unpaired electron concentrations and the breakdown voltages of the inventive aluminum nitride sintered bodies are remarkably improved as compared with the conventional aluminum nitride sintered bodies. When the relation between the unpaired electron concentration values and the breakdown voltages is shown as a straight line to measure the slope or inclination of this straight line, it is understood that the prior art exhibits a slope or inclination of a $1.0\times 10^{-14}$ while the inventive sintered body exhibits a slope or inclination of $1.3\times 10^{-13}$, i.e., 13 times as compared with the prior art. In other words, it is possible to increase the unpaired electron concentration by one digit, i.e. a power of ten, and double the breakdown voltage at the maximum according to the present invention.

From the linear relation between the unpaired electron concentration values land the breakdown voltages, it is also recognized that it is possible to confirm the breakdown voltage of the sintered body by a nondestructive test through measurement of the unpaired electron concentration.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. An aluminum nitride sintered body comprising aluminum nitride crystal grains and titanium included as a solid solute in said crystal grains in a weight ratio of at least 50 ppm and not more than 1000 ppm, and containing an oxy-nitride of titanium and aluminum therein in a weight ratio of at least 0.1% and not more than 5.0% in terms of $TiO_2$, wherein an unpaired electron concentration in said sintered body as determined from an absorption spectrum of electron spin resonance is at least $1\times 10^{13}$/g.

2. The aluminum nitride sintered body in accordance with claim 1, wherein said oxy-nitride exists in said sintered body in the form of grains having a diameter of not more than 800 nm.

3. The aluminum nitride sintered body in accordance with claim 2, having a thermal conductivity of at least 150 W/mK.

4. The aluminum nitride sintered body in accordance with claim 1, having a breakdown voltage of at least 20 kV/mm.

5. The aluminum nitride sintered body in accordance with claim 1, having a breakdown voltage of at least 30 kV/mm.

6. The aluminum nitride sintered body in accordance with claim 1, wherein said crystal grains comprise a crystal lattice, and said titanium is included as a solid solute in said crystal lattice.

* * * * *

UNITED STATES PATENT AND TRADEMARK OFFICE
CERTIFICATE OF CORRECTION

PATENT NO. : 5,393,715
DATED : February 28, 1995
INVENTOR(S) : Nakahata et al.

It is certified that error appears in the above-indentified patent and that said Letters Patent is hereby corrected as shown below:

Column 4, line 2, replace "nitride" by --oxy-nitride--.
Column 5, line 33, after "Al," insert --O--.
Column 9, line 7, replace "e" by --a--;
line 56, replace "tho" by --the--;
line 65, replace "fared" by --fired--.
Column 10, line 15, replace "Table i" by --Table 1--;
In Table 5, in Comparative Sample 8, replace "7.5 x $10^{12}$" by --7.6 x $10^{12}$--.
Column 11, line 19, replace "land" by --and--.

Signed and Sealed this

Ninth Day of May, 1995

Attest:

BRUCE LEHMAN

Attesting Officer

Commissioner of Patents and Trademarks